United States Patent
Kobayashi et al.

(10) Patent No.: US 10,331,030 B2
(45) Date of Patent: Jun. 25, 2019

(54) IMPRINT MATERIAL

(71) Applicant: NISSAN CHEMICAL INDUSTRIES, LTD., Tokyo (JP)

(72) Inventors: Junpei Kobayashi, Funabashi (JP); Taku Kato, Funabashi (JP); Keisuke Shuto, Funabashi (JP); Masayoshi Suzuki, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 164 days.

(21) Appl. No.: 15/505,483

(22) PCT Filed: Jul. 24, 2015

(86) PCT No.: PCT/JP2015/071135
§ 371 (c)(1),
(2) Date: Feb. 21, 2017

(87) PCT Pub. No.: WO2016/027619
PCT Pub. Date: Feb. 25, 2016

(65) Prior Publication Data
US 2017/0269474 A1 Sep. 21, 2017

(30) Foreign Application Priority Data
Aug. 21, 2014 (JP) .................................. 2014-168425

(51) Int. Cl.
G03F 7/00 (2006.01)
C08F 2/44 (2006.01)
(Continued)

(52) U.S. Cl.
CPC .............. *G03F 7/0002* (2013.01); *C08F 2/44* (2013.01); *C08F 2/48* (2013.01); *C08F 290/068* (2013.01);
(Continued)

(58) Field of Classification Search
CPC ......... C08F 290/068; Y10T 428/24802; G03F 7/0002; G03F 7/027; G03F 7/0757; G03F 7/0755
See application file for complete search history.

(56) References Cited

U.S. PATENT DOCUMENTS

| | | |
|---|---|---|
| 5,772,905 A | 6/1998 | Chou |
| 2010/0244169 A1* | 9/2010 | Maeda .................. G02B 1/118 257/432 |
| 2016/0251469 A1* | 9/2016 | Kobayashi ............ G03F 7/0002 428/195.1 |

FOREIGN PATENT DOCUMENTS

| | | |
|---|---|---|
| JP | 2008-105414 A | 5/2008 |
| JP | 2008-202022 A | 9/2008 |

(Continued)

OTHER PUBLICATIONS

Machine translation of detailed description of JP 2012-099638 acquired on Aug. 25, 2018.*
(Continued)

*Primary Examiner* — Gerard Higgins
(74) *Attorney, Agent, or Firm* — Oliff PLC

(57) ABSTRACT

A novel imprint material and film produced from the material, on which a pattern is transferred. An imprint material having: a component (A); a component (B); a component (C); and a component (D), wherein, (A): a compound of Formula (1), Formula (2), or Formula (3):

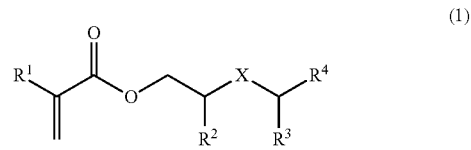

(1)

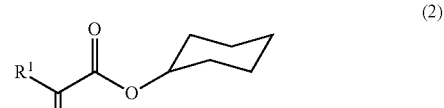

(2)

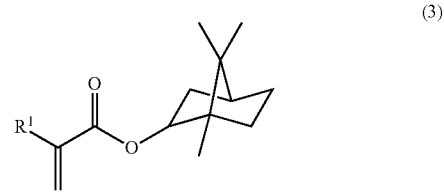

(3)

wherein, X is $C_{1-5}$ linear alkylene, $R^1$ is H or $CH_3$; each of $R^2$, $R^3$, and $R^4$ is independently H, $CH_3$, or $C_2H_5$; and the sum of the number of carbon atoms on $R^2$, $R^3$, and $R^4$ is 0 to 2; (B): a silsesquioxane compound having a repeating unit of Formula (4), and having two or more polymerizable groups of Y; (C): a silicone compound having a repeating unit of Formula (5), and having two polymerizable groups on its ends:

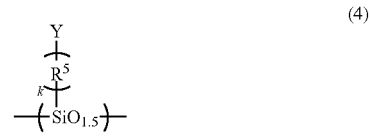

(4)

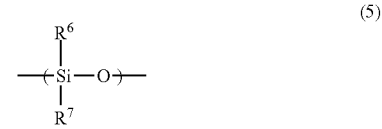

(5)

wherein, each of $R^6$ and $R^7$ is independently $C_{1-3}$ alkyl; $R^5$ is $C_{1-3}$ alkylene; and k is 0 to 3; and (D): photopolymerization initiator.

15 Claims, No Drawings

(51) Int. Cl.
*H01L 21/027* (2006.01)
*C08F 290/06* (2006.01)
*C08F 2/48* (2006.01)
*G03F 7/027* (2006.01)
*G03F 7/038* (2006.01)
*G03F 7/075* (2006.01)
*C08F 290/14* (2006.01)
*C08F 220/18* (2006.01)

(52) U.S. Cl.
CPC .......... *C08F 290/148* (2013.01); *G03F 7/027* (2013.01); *G03F 7/038* (2013.01); *G03F 7/0755* (2013.01); *G03F 7/0757* (2013.01); *H01L 21/027* (2013.01); *C08F 2220/1841* (2013.01); *C08F 2220/1875* (2013.01); *Y10T 428/24802* (2015.01)

(56) References Cited

FOREIGN PATENT DOCUMENTS

| | | |
|---|---|---|
| JP | 2009-259370 A | 11/2009 |
| JP | 2010-013514 A | 1/2010 |
| JP | 2011-204309 A | 10/2011 |
| JP | 2012-030423 A | 2/2012 |
| JP | 2012-099638 A | 5/2012 |
| JP | 2013-065768 A | 4/2013 |
| WO | 2009/069465 A1 | 6/2009 |

OTHER PUBLICATIONS

Oct. 13, 2015 Search Report issued in International Patent Application No. PCT/JP2015/071135.

Oct. 13, 2015 Written Opinion issued in International Patent Application No. PCT/JP2015/071135.

\* cited by examiner

IMPRINT MATERIAL

TECHNICAL FIELD

The present invention relates to an imprint material (a composition for forming a film for imprint) and a film produced from the material, on which a pattern is transferred. More specifically, the present invention relates to an imprint material for forming a cured film, in which the cured film on which the pattern is transferred is easily detached from a mold after curing, and is heat resistant to a heating process at a temperature over 200° C., as well as relates to the film produced from the material, on which the pattern is transferred.

BACKGROUND ART

In 1995, Professor Chou who is currently at Princeton University and others developed a novel technology called nanoimprint lithography (Patent Document 1). The nanoimprint lithography is a technology in which a mold having any pattern is caused to contact with a base material on which a resin film is formed; and pressure is applied to the resin film while applying an external stimulation such as heat and light to form a desired pattern on the cured resin film. The nanoimprint lithography makes simple and low-cost nanoscale processes available, and thus is advantageous compared to conventional photolithography and the like used for manufacturing semiconductor devices.

The nanoimprint lithography is expected to be applied to manufacture of semiconductor devices, optical devices, displays, storage media, biochips, and the like, instead of photolithography, and thus various reports about curable compositions for photonanoimprint lithography used for nanoimprint lithography have been published (Patent Documents 2 and 3). In addition, a photoimprint material containing a compound having a silicone skeleton and a photopolymerization initiator is described in Patent Document 4; and a curable resin composition for transfer materials used to form a fine pattern by an imprint method, which contains a compound having a silsesquioxane skeleton and a polymerization initiator is described in Patent Document 5.

When an expensive mold is used in nanoimprint lithography, the life of the mold needs to be longer; however, if a force for peeling the mold from a cured resin film, that is, a peel force at the time of mold release (hereinafter referred to as a "mold release force") is large, the resin tends to adhere to the mold and the mold tends to become unusable. Accordingly, a low mold release force (a characteristic to easily peel a cured resin film from a mold) is required for a material used for nanoimprint lithography (hereinafter referred to as "imprint material"). Also, an external force is sometime applied to a resin film at the time of manufacturing devices, and a resin film deformed by such a force cannot be used for devices. Thus low plastic deformation, that is, a low plastic deformation characteristic is required. For manufacture of devices, heating processes such as baking and soldering may be taken. The temperature in the heating processes may be around 265° C. If the heat-resistance of a resin film to such temperature is low, a degradation product will be sublimed from the resin film, causing contamination of insides of devices, as well as apparatuses and equipment for making the devices. In addition, if the film has low resistance to stress generated at cooling from high temperature, the film will be cracked and defected. As the thickness of a film becomes larger, the film will be cracked more often. Some devices may be used under a heating environment, and will have the same problems. Therefore, in the products such as solid-state image sensing devices, solar cells, LED devices, and displays, the structure manufactured as an optical component is required to be highly heat resistant and crack resistant. To date, a variety of materials have been disclosed as imprint materials; however, any of them do not have all of: a low mold release force, a low plastic deformation characteristic, heat resistance that does not allow a degradation product to be sublimed at a temperature over 200° C., such as 265° C., and crack resistance.

PRIOR ART DOCUMENTS

Patent Documents

Patent Document 1: U.S. Pat. No. 5,772,905 (U.S. Pat. No. 5,772,905 B2)
Patent Document 2: Japanese Patent Application Publication No. 2008-105414 (JP 2008-105414 A)
Patent Document 3: Japanese Patent Application Publication No. 2008-202022 (JP 2008-202022 A)
Patent Document 4: Japanese Patent Application Publication No. 2013-065768 (JP 2013-065768 A)
Patent Document 5: International Publication No. WO 2009/069465 (WO 2009/069465 A1)

SUMMARY OF THE INVENTION

Problem to be Solved by the Invention

The present invention has been completed in view of the above-described circumstances, and a problem to be solved by the invention is to provide an imprint material for forming a cured film, in which the cured film on which a pattern is transferred can be easily detached from a mold after curing, that is, has a low mold release force; has a low rate of plastic deformation (plastic deformation rate) to an external force; is highly heat resistant not allowing a degradation product to be sublimed at a temperature over 200° C.; and has crack resistance, so that the thick film is not cracked when the temperature is dropped rapidly. In addition, a film produced from the material, on which a pattern is transferred, is provided. Specifically, an object of the present invention is to provide a material to form a cured film having a mold release force of over 0 g/cm, but not over 0.7 g/cm; having a plastic deformation rate of 8% or less; not allowing a degradation product to be sublimed at a temperature such as 265° C.; and not cracked when the temperature is dropped rapidly from 265° C., even if the thickness is around 20 μm.

Means for Solving the Problem

As a result of intensive study to solve the problems described above, the present inventors found that, a composition containing a compound having one $C_{4-10}$ linear, branched, or cyclic hydrocarbon group and one polymerizable group; a silsesquioxane compound having two or more polymerizable groups; and a silicone compound having two polymerizable groups on its ends; as well as further containing a photopolymerization initiator can be used as an imprint material. Then, the present inventors found that a mold release force that is measured when a cured film, on which a concavity and convexity shape pattern of a mold is transferred by light curing of the material on a surface of the mold having the concavity and convexity shape, is peeled from the surface of the mold having the concavity and convexity shape is extremely small; a film produced with the material, on which a pattern is transferred, has a small plastic deformation rate; a degradation product is not sublimed even at a temperature of 265° C.; and the film is not cracked when the temperature is dropped rapidly from 265° C.; and whereby the present invention was completed.

As a first aspect, the present invention relates to an imprint material comprising a component (A), a component (B), a component (C), and a component (D) below, in which a content of the component (A) is 35 parts by mass to 90 parts by mass, a content of the component (B) is 5 parts by mass to 60 parts by mass, and a content of the component (C) is 5 parts by mass to 30 parts by mass, and a content of the component (D) is 0.1 phr to 30 phr, provided that the sum of the components (A), (B), and (C) is 100 parts by mass.

(A): a compound of Formula (1), Formula (2), or Formula (3) below:

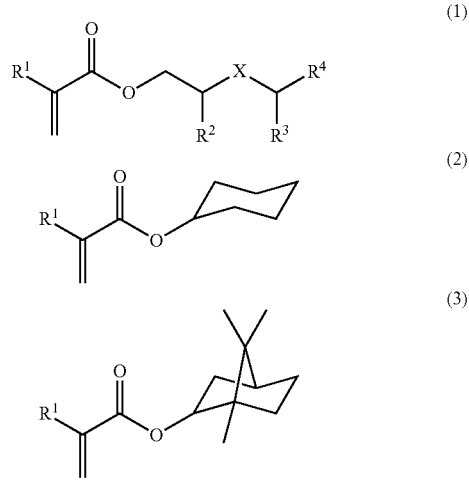

(in the Formulae, X is a $C_{1-5}$ linear alkylene group, $R^1$ is a hydrogen atom or a methyl group; each of $R^2$, $R^3$, and $R^4$ is independently a hydrogen atom, a methyl group, or an ethyl group; and the sum of the number of carbon atoms on $R^2$, $R^3$, and $R^4$ is an integer of 0 to 2).

(B): a silsesquioxane compound having a repeating unit of Formula (4) below, and having two or more polymerizable groups of Y in Formula (4).

(C): a silicone compound having a repeating unit of Formula (5) below, and having two polymerizable groups on its ends:

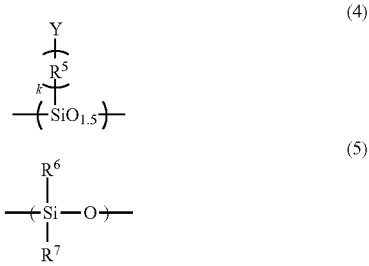

(in the Formulae, each of $R^6$ and $R^7$ is independently a $C_{1-3}$ alkyl group; $R^5$ is a $C_{1-3}$ alkylene group; and k is an integer of 0 to 3).

(D): photopolymerization initiator.

As a second aspect, the present invention relates to the imprint material according to the first aspect, in which the component (B) comprises a mixture of a complete cage structure and/or an incomplete cage structure, and a random structure and a ladder structure.

As a third aspect, the present invention relates to the imprint material according to the first or second aspect, in which the component (C) comprises two or more compounds having molecular weights different from each other.

As a fourth aspect, the present invention relates to the imprint material according to any one of the first to third aspects, further comprising an antioxidant as a component (E).

As a fifth aspect, the present invention relates to the imprint material according to any one of the first to fourth aspects, further comprising a surfactant as a component (F).

As a sixth aspect, the present invention relates to the imprint material according to any one of the first to fifth aspects, further comprising a solvent as a component (G).

As a seventh aspect, the present invention relates to the imprint material according to any one of the first to sixth aspects, in which the polymerizable groups of the component (B) and the component (C) are an acryloyloxy group, a methacryloyloxy group, a vinyl group, or an allyl group.

As an eighth aspect, the present invention relates to a film produced from the imprint material according to any one of the first to seventh aspects, on which a pattern is transferred.

As a ninth aspect, the present invention relates to an optical component comprising, on a base material thereof, the film according to the eighth aspect, on which a pattern is transferred.

As a tenth aspect, the present invention relates to a solid-state image sensing device comprising, on a base material thereof, the film according to the eighth aspect, on which a pattern is transferred.

As an eleventh aspect, the present invention relates to an LED device comprising, on a base material thereof, the film according to the eighth aspect, on which a pattern is transferred.

As a twelfth aspect, the present invention relates to a semiconductor device comprising the film according to the eighth aspect, on which a pattern is transferred.

As a thirteenth aspect, the present invention relates to a solar cell comprising, on a base material thereof, the film according to the eighth aspect, on which a pattern is transferred.

As a fourteenth aspect, the present invention relates to a display comprising, on which a base material thereof, the film according to the eighth aspect, on which a pattern is transferred.

As a fifteenth aspect, the present invention relates to an electronic device, on a base material thereof, comprising, the film according to the eighth aspect, on which a pattern is transferred.

Effects of the Invention

A cured film manufactured from the imprint material of the present invention has a low mold release force, a low plastic deformation characteristic. In addition, a degradation product is not sublimed at a temperature such as 265° C., and the cured film is not cracked when the temperature is dropped rapidly from 265° C.

Also, light curing is applicable to the imprint material of the present invention, and when a film is peeled from the surface of a mold, which has a concavity and convexity shape, a portion of a pattern will not be peeled, and thus a film on which a desired pattern is accurately formed can be obtained. Accordingly, a good photoimprint pattern can be formed.

Also, the imprint material of the present invention can form films on any base materials, and a pattern-transferred film formed after imprinting can suitably be applied to products, such as solar cells, LED devices, and displays that use components which are required to be highly transparent.

In addition, in the imprint material of the present invention, a cure rate, dynamic viscosity, and the film thickness of a cured film to be formed, can be controlled by selecting types and contents of the compounds of the components (A), (B), and (C), and can form a relatively thick cured film, for example, having the thickness of 20 μm. Accordingly, by using the imprint material of the present invention, a material can be designed in accordance with the type of a device to be manufactured, and in accordance with the types of an exposure process and a baking process. Thus, the imprint material of the present invention can expand a process margin, and can suitably be used for manufacturing optical components.

MODES FOR CARRYING OUT THE INVENTION

<Component (A)>

In the component (A), the compounds of Formula (1), Formula (2), or Formula (3) may be a mixture of these compounds.

Examples of the polymerizable group include an acryloyloxy group, a methacryloyloxy group, a vinyl group, and an allyl group. An acryloyloxy group may be described as an acryloxy group, and a methacryloyloxy group may be described as a methacryloxy group herein.

Specific examples of the compound of the component (A) include n-butyl acrylate, n-pentyl (meth)acrylate, n-hexyl (meth)acrylate, 2-ethylhexyl (meth)acrylate, n-heptyl (meth)acrylate, n-octyl (meth)acrylate, isooctyl (meth)acrylate, n-nonyl (meth)acrylate, and n-decyl (meth)acrylate. Note that the (meth)acrylate compound herein refers to both an acrylate compound and a methacrylate compound. For example, (meth) acrylic acid refers to acrylic acid and methacrylic acid.

The compound of the component (A) is commercially available, and specific examples thereof include butyl acrylate, hexyl acrylate, hexyl methacrylate, 2-ethylhexyl acrylate, and 2-ethylhexyl methacrylate (all of the above, manufactured by Tokyo Chemical Industry Co., Ltd.); n-amyl acrylate, n-amyl methacrylate, n-heptyl acrylate, n-heptyl methacrylate, n-octyl acrylate, n-octyl methacrylate, isooctyl acrylate, isooctyl methacrylate, n-nonyl acrylate, n-nonyl methacrylate, n-decyl acrylate, and n-decyl methacrylate (all of the above, manufactured by ABCR GmbH & Co. KG); LIGHT ACRYLATE IB-XA, LIGHT ESTER NB, LIGHT ESTER CH, and LIGHT ESTER IB-X (all of the above, manufactured by Kyoeisha Chemical Co., Ltd.); NOAA, V#155, and IBXA (all of the above, manufactured by Osaka Organic Chemical Industry Ltd.).

The compound of the component (A) can be used alone, or two or more types can be used in combination.

In the present invention, the component (A) can impart a low plastic deformation characteristic and crack resistance to the imprint material, and a content thereof is preferably 35 parts by mass to 90 parts by mass, provided that the sum of the component (A) and the later-mentioned components (B) and (C) is 100 parts by mass. When the part by mass is too small, a plastic deformation rate will be increased, and crack will be seen upon rapid cooling. Meanwhile, when the part by mass is too large, a sufficient curing property cannot be obtained, and patterning properties will be deteriorated. In order to further decrease the plastic deformation rate, the compound of Formula (1), Formula (2), or Formula (3) is preferably used as the component (A).

<Component (B)>

The silsesquioxane compound of the component (B), having two or more polymerizable groups, refers to a compound having an Si—O—Si bond as a main chain skeleton, having 1.5 oxygen atoms in the repeat unit of Formula (4), and having two or more polymerizable groups of Y in Formula (4). Examples of the polymerizable group include an acryloyloxy group, a methacryloyloxy group, a vinyl group, and an allyl group. Examples of the $C_{1-3}$ alkylene group of $R^5$ in Formula (4) include a methylene group, an ethylidene group [a —CH(CH$_3$)— group], and a propane-2,2-diyl group [a —C(CH$_3$)$_2$— group].

The compound of the component (B) is commercially available, and specific examples thereof include AC-SQ TA-100, MAC-SQ TM-100, AC-SQ SI-20, MAC-SQ SI-20, and MAC-SQ HDM (all of the above, manufactured by Toagosei Co., Ltd.).

The compound of the component (B) can also be synthesized by using, for example, a compound of Formula (6) or Formula (7) below:

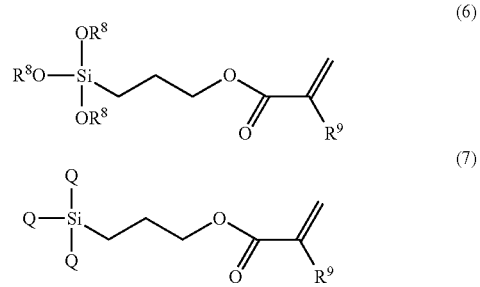

(in the Formulae, each of the three $R^8$s is independently a methyl group or an ethyl group; $R^9$ is a hydrogen atom or a methyl group; and each of the three Qs is independently a halogen group).

Examples of the compound of Formula (6) include 3-acryloyloxypropyltrimethoxysilane, 3-acryloyloxypropyltriethoxysilane, 3-(trimethoxysilyl)propyl methacrylate, and 3-(triethoxysilyl)propyl methacrylate. Examples of the compound of Formula (7) include 3-acryloyloxypropyltrichlorosilane and 3-(trichlorosilyl)propyl methacrylate.

As the compound of the component (B), silsesquioxane compound having weight-average molecular weight of, for example, 700 to 7,000 can be used, and such compound can be used alone, or two or more types can be used in combination.

In the imprint material of the present invention, the component (B) imparts heat resistance to a pattern-transferred film to suppress sublimation of a degradation product at a temperature over 200° C., for example, 265° C. Also, dynamic viscosity of the imprint material, a cure rate at the time of imprinting, and the film thickness of the formed cured film can be controlled by selecting the type, weight-average molecular weight, and content of the component (B).

In the present invention, a content of the component (1) is preferably 5 parts by mass to 60 parts by mass, and more preferably 15 parts by mass to 60 parts by mass, provided that the sum of the component (A), component (B), and the later-mentioned component (C) is 100 parts by mass. When the part by mass is too small, a sufficient curing property cannot be obtained, and patterning properties will be deteriorated, and when it is too large, crack resistance is decreased, and crack will be seen upon rapid cooling.

<Component (C)>

The component (C), a silicone compound having two polymerizable groups on its ends, refers to a compound having a silicone skeleton (siloxane skeleton) in the molecule, and having two polymerizable groups on the ends of the molecule. As examples of the silicone skeleton, each of $R^6$ and $R^7$ in Formula (5) is independently a methyl group, an ethyl group, a propyl group, or an isopropyl group. In particular, a dimethyl silicone skeleton in which both of $R^6$ and $R^7$ are methyl groups is preferable. Examples of the polymerizable group include an acryloyloxy group, a methacryloyloxy group, a vinyl group, and an allyl group.

The compound of the component (C) is commercially available, and specific examples thereof include X-22-164, X-22-164AS, X-22-164A, X-22-164B, X-22-164C, X-22-164E, X-22-2445, and X-22-1602 (all of the above, manufactured by Shin-Etsu Chemical Co., Ltd.).

The compound of the component (C) can be used alone, or two or more types can be used in combination. In particular, a curing property can be controlled by using two types of the compounds having weight-average molecular weights different from each other, so that a lower mold release force will be obtained while keeping heat resistance.

In the present invention, a content of the component (C) is, for example, 5 parts by mass to 30 parts by mass, and preferably 5 parts by mass to 18 parts by mass, provided that the sum of the components (A), (B), and (C) is 100 parts by mass. When the part by mass is too small, a sufficiently low mold release force cannot be obtained, and when it is too large, a degradation product will be sublimated at a temperature over 200° C., such as 265° C.

<Component (D)>

Although a photopolymerization initiator as the component (D) is not particularly limited, as long as it has absorption corresponding to a light source used for light curing. Examples of the photopolymerization initiator include organic peroxides, such as tert-butylperoxy-iso-butyrate, 2,5-dimethyl-2,5-bis(benzoyldioxy)hexane, 1,4-bis[α-(tert-butyldioxy)-iso-propoxy]benzene, di-tert-butylperoxide, 2,5-dimethyl-2,5-bis(tert-butyldioxy)hexenehydroperoxide, α-(iso-propylphenyl)-iso-propylhydroperoxide, tert-butylhydroperoxide, 1,1-bis(tert-butyldioxy)-3,3,5-trimethylcyclohexane, butyl-4,4-bis(tert-butyldioxy)valerate, cyclohexanoneperoxide, 2,2',5,5'-tetra(tert-butylperoxycarbonyl)benzophenone, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3'-bis(tert-butylperoxycarbonyl)-4,4'-dicarboxybenzophenone, tert-butylperoxybenzoate, and di-tert-butyldiperoxyisophthalate; quinones, such as 9,10-anthraquinone, 1-chloroanthraquinone, 2-chloroanthraquinone, octamethylanthraquinone, and 1,2-benzanthraquinone; benzoin derivatives, such as benzoin methyl, benzoin ethyl ether, α-methylbenzoin, and α-phenylbenzoin; alkylphenone compounds, such as 2,2-dimethoxy-1,2-diphenylethane-1-one, 1-hydroxy-cyclo-hexyl-phenyl-ketone, 2-hydroxy-2-methyl-1-phenyl-propane-1-one, 1-[4-(2-hydroxyethoxy)-phenyl]-2-hydroxy-2-methyl-1-propane-1-one, 2-hydroxy-1-[4-{4-(2-hydroxy-2-methyl-propionyl)benzyl}-phenyl]-2-methyl-propane-1-one, phenylglyoxylic acid methyl ester, 2-methyl-1-[4-(methylthio)phenyl]-2-morpholinopropane-1-one, 2-benzyl-2-dimethylamino-1-(4-morpholinophenyl)-1-butanone, and 2-dimethylamino-2-(4-methyl-benzyl)-1-(4-morpholin-4-yl-phenyl)-butane-1-one; acylphosphine oxide compounds, such as bis(2,4,6-trimethylbenzoyl)-phenylphosphine oxide and 2,4,6-trimethylbenzoyl-diphenyl-phosphine oxide; and oxime ester compounds, such as 2-(O-benzoyloxime)-1-[4-(phenylthio)phenyl]-1,2-octanedione and 1-(O-acetyloxime)-1-[9-ethyl-6-(2-methylbenzoyl)-9H-carbazole-3-yl]ethanone.

The above-described compounds are commercially available, and specific examples thereof include IRGACURE (registered trademark) 651, IRGACURE 184, IRGACURE 500, IRGACURE 2959, IRGACURE 127, IRGACURE 754, IRGACURE 907, IRGACURE 369, IRGACURE 379, IRGACURE 379EG, IRGACURE 819, IRGACURE 819DW, IRGACURE 1800, IRGACURE 1870, IRGACURE 784, IRGACURE OXE01, IRGACURE OXE02, IRGACURE 250, IRGACURE 1173, IRGACURE MBF, IRGACURE 4265, and IRGACURE TPO (all of the above, manufactured by BASF Japan Ltd.); KAYACURE (registered trademark) DETX, KAYACURI MBP, KAYACURE DMBI, KAYACURE EPA, and KAYACURE OA (all of the above, manufactured by Nippon Kayaku Co., Ltd.); VICURE-10, and VICURE-55 (all of the above, manufactured by STAUFFER Co. LTD); ESACURE (registered trademark) KIP 150, ESACURE TZT, ESACURI 1001, ESACURE KT046, ESACURE KBI, ESACURE KL200, ESACURE KS300, ESACURE EB3, triazine-PMS, triazine A, and triazine B (all of the above, manufactured by Nihon SiberlHegner K.K.); Adeka Optomer N-1717, Adeka Optomer N-1414, and Adeka Optomer N-1606 (manufactured by ADEKA Corporation).

The photopolymerization initiator of the component (D) can be used alone, or two or more types can be used in combination.

In the imprint material of the present invention, a content of the component (D) is preferably 0.1 phr to 30 phr, and more preferably 1 phr to 20 phr to the total amount of the components (A), (B), and (C). When a content of the component (D) is less than 0.1 phr, a sufficient curing property cannot be obtained, and patterning properties will be deteriorated. Note that "phr" herein refers to a content of the photopolymerization initiator, relative to 100 parts by mass of the sum of the components (A), (B), and (C).

<Component (E)>

To the imprint material of the present invention, an antioxidant may be added as the component (E). Examples of the antioxidant include IRGANOX (registered trademark) 1010, IRGANOX 1035, IRGANOX 1076, IRGANOX 1135, and IRGANOX 1520L (all of the above, BASF Japan Ltd.); and SUMILIZER (registered trademark) GA-80 (manufactured by Sumitomo Chemical Co., Ltd.).

The above-described antioxidant can be used alone, or two or more types can be used in combination. By using the antioxidant, discoloring of a film to yellow by oxidation can be prevented In the imprint material of the present invention, a content of the component (E) is preferably 0.1 phr to 2 phr to the total mass of the components (A), (B), and (C).

<Component (F)>

To the imprint material of the present invention, a surfactant may be added as the component (F). A surfactant as the component (F) adjusts film-formability of a coating film to be obtained. Examples of the surfactant include nonionic surfactants including polyoxyethylene alkylethers, such as polyoxyethylene lauryl ether, polyoxyethylene stearyl ether, polyoxyethylene cetyl ether, and polyoxyethylene oleyl ether; polyoxyethylene alkylarylethers, such as polyoxyethylene octyl phenol ether and polyoxyethylene nonyl phenol ether; polyoxyethylene-polyoxypropylene block copolymers: sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants including the product name: Eftop (registered trademark) EF301, Eftop EIF303, and Eftop EF352 (Mitsubishi Materials Electronic Chemicals Co., Ltd.), the product name: MEGAFACE (registered trademark) F-553, F-554, F-556, F-477, F-171, MEGAFACE F-173, MEGAFACE R-08, MEGAFACE R-30, MEGAFACE R-30N, MEGAFACE R-40, and MEGAFACE R-40-LM (manufactured by DIC Corporation), Fluorad FC430 and Fluorad FC431 (manufactured by Sumitomo 3M Limited), and the product name: AsahiGuard (registered trademark) AG710, SURFLON (registered trademark) S-382, SURFLON SC101, SURFLON SC102, SURFLON SC103, SURFLON SC104, SURFLON SC105, and SURFLON SC106 (manufactured by Asahi Glass Co., Ltd.); and organosiloxane polymer KP341 (manufactured by Shin-Etsu Chemical Co., Ltd.).

The above-described surfactant can be used alone, or two or more types can be used in combination. When the surfactant is used, a content thereof is preferably 0.01 phr to 40 phr, and more preferably 0.01 phr to 10 phr to the total mass of the components (A), (B), and (C).

<Component (G)>

The present invention may contain a solvent as the component (G). The component (G) adjusts viscosities of the components (A), (B), and (C).

Examples of the solvent include toluene, p-xylene, o-xylene, styrene, ethylene glycol dimethyl ether, propylene glycol monomethyl ether, ethylene glycol monomethyl ether, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, 2-heptanone, ethyl pyruvate, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, trimethylene glycol, 1-methoxy-2-butanol, isopropyl ether, 1,4-dioxane, N,N-dimethylformamide, N,N-dimethylacetamide, N-methyl-2-pyrrolidone, 1,3-dimethyl-2-imidazolidinone, dimethyl sulfoxide, and N-cyclohexyl-2-pyrrolidine. The solvent is not particularly limited, as long as it can adjust viscosities of the components (A), (B), and (C).

The solvent of the component (G) can be used alone, or two or more types can be used in combination. When the solvent is used, the solid content, which is defined as the whole content including the components (A) to (D), the components (E) and (F) as optional contents, and the later-mentioned other additives, but excluding the solvent of the component (G), is preferably 10% by mass to 95% by mass to the imprint material of the present invention.

<Other Additive>

If desired, the imprint material of the present invention can contain an epoxy compound, a photo acid generator, a photosensitizer, a ultraviolet absorber, an adhesion aid, or a mold release improving agent, as long as the effects of the present invention is not impaired.

Examples of the epoxy compound include X-22-2046, X-22-343, X-22-2000, X-22-4741, X-22-163, X-22-163A, X-22-163B, X-22-163C, X-22-169AS, X-22-169B, X-22-173BX, X-22-173DX, X-22-9002, KF-102, KF-101, KF-1001, KF-1002, KF-1005, and KF-105 (all of the above, manufactured by Shin-Etsu Chemical Co., Ltd.), EPOLEAD (registered trademark) GT-401, EPOLEAD PB3600, CELLOXIDE (registered trademark) 2021P, CELLOXIDE 2000, CELLOXIDE 3000, EHPE 3150, EHPE 3150CE, and CYCLOMER (registered trademark) M100 (all of the above, manufactured by Daicel Corporation), EPICLON (registered trademark) 840, EPICLON 840-S, EPICLION N-660, and EPICLON N-673-80M (all of the above, manufactured by DIC Corporation).

Examples of the photo acid generator include IRGACURE (registered trademark) PAG103, IRGACURE PAG108, IRGACURE PAG121, IRGACURE PAG203, and IRGACURE CG1725 (all of the above, manufactured by BASF Japan Ltd.), WPAG-145, WPAG-170, WPAG-199, WPAG-281, WPAG-336, and WPAG-367 (all of the above, manufactured by Wako Pure Chemical Industries, Ltd.), TFE triazine, TME-triazine, MP-triazine, dimethoxy triazine, TS-91, and TS-01 (manufactured by SANWA Chemical Co., Ltd.).

Examples of the photosensitizer include thioxanthenes, xanthenes, ketones, thiopyrylium salts, base styryls, merocyanines, 3-substituted coumarins, 3,4-substituted coumarins, cyanines, acridines, thiazines, phenothiazines, anthracenes, coronenes, benzanthracenes, perylenes, ketocoumarins, coumarins, and borates.

The photosensitizer can be used alone, or two or more types can be used in combination. UV absorption wavelengths can be adjusted by using the photosensitizer.

Examples of the ultraviolet absorber include TINUVIN (registered trademark) PS, TINUVIN 99-2, TINUVIN 109, TINUVIN 328, TINUVIN 384-2, TINUVIN 400, TINUVIN 405, TINUVIN 460, TINUVIN 477, TINUVIN 479, TINUVIN 900, TINUVIN 928, TINUVIN 1130, TINUVIN 111FDL, TINUVIN 123, TINUVIN 144, TINUVIN 152, TINUVIN 292, TINUVIN 5100, TINUVIN 400-DW, TINUVIN 477-DW, TINUVIN 99-DW, TINUVIN 123-DW, TINUVIN 5050, TINUVIN 5060, and TINUVIN 5151 (all of the above, BASF Japan Ltd.).

The ultraviolet absorber can be used alone, or two or more types can be used in combination. When light curing is performed, the cure rate of the outermost surface of a film can be controlled by using the ultraviolet absorber, and thus mold release may be improved.

Examples of the adhesion aid include 3-methacryloxypropyltrimethoxysilane and 3-acryloxypropyltrimethoxysilane. By using the adhesion aid, adherence to a base material will be improved. A content of the adhesion aid is preferably 5 phr to 50 phr, and more preferably 10 phr to 50 phr to the total mass of the components (A), (B), and (C).

Examples of the mold release improving agent include fluorine-containing compounds. Examples of the fluorine-containing compound include R-5410, R-1420, M-5410, M-1420, E-5444, E-7432, A-1430, and A-1630 (all of the above, manufactured by Daikin Industries, Ltd.).

<Preparation of Imprint Material>

A method for preparing the imprint material of the present invention is not particularly limited. In the method, the components (A), (B), (C), and (D); the components (E), (F), and (G), as optional contents; and if desired, other additives are mixed, so that the imprint material becomes homogeneous. Also the order of mixing the components (A) to (G), and if desired, other additives, is not particularly limited, as long as a homogeneous imprint material is obtained. In an example of the preparation method, the components (A), (B), (C), and (D) are mixed with given contents. In another example of the preparation method, the components (E), (F), and (G) are further mixed therein to obtain a homogeneous imprint material. In still another example of the preparation method, other additives are further added and mixed in an appropriate step(s), if desired.

<Photoimprint and Pattern-Transferred Film>

The imprint material of the present invention can be applied onto a base material, and light-cured to obtain a desired cured film. Examples of application methods include well known or publicly known methods, such as a spin coating method, a dip method, a flow coating method, an ink-jet method, a spray method, a bar coating method, a gravure coating method, a slit coating method, a roll coating method, a transferring printing method, brush coating, a blade coating method, and an air knife coating method.

Examples of the base material onto which the imprint material of the present invention is applied include base materials comprising silicon wafers; glass on which film of an indium tin oxide (ITO) is formed (hereinafter, abbreviated as "ITO substrate"); glass on which film of a silicon nitride (SiN) is formed (SiN substrate); glass on which film of an indium zinc oxide (IZO) is formed; polyethylene terephthalate (PET); triacetyl cellulose (TAC); acryl; plastic; glass; quartz; or ceramics. Also, flexible base materials, such as base materials comprising triacetyl cellulose, polyethylene terephthalate, polymethyl methacrylate, cycloolefin (co) polymers, polyvinylalcohols, polycarbonates, polystyrene, polyimides, polyamides, polyolefins, polypropylene, polyethylene, polyethylene naphthalate, or polyether sulfone; and comprising copolymers in which these polymers are combined can also be used.

The light source used for curing the imprint material of the present invention is not particularly limited, and examples thereof include high-pressure mercury lamps, low-pressure mercury lamps, electrodeless lamps, metal halide lamps, KrF excimer lasers, ArF excimer lasers, $F_2$ excimer lasers, electron beams (EB), and extreme ultraviolet (EUV). Generally, the wavelengths that can be used are a G-line of 436 nm, an H-line of 405 nm, an 1-line of 365 nm, and a GHI-mixed line. In addition, the amount of exposure is preferably 30 mJ/cm$^2$ to 2,000 mJ/cm$^2$, and more preferably 30 mJ/cm$^2$ to 1,000 mJ/cm$^2$.

When a solvent of the component (G) is used, a baking step can be applied to at least one of a coating film before light irradiation and a cured film after light irradiation, in order to evaporate the solvent. An instrument for baking is not particularly limited, as long as heating under suitable atmosphere, that is, under air, an inert gas such as nitrogen, or under vacuum, is possible by using, for example, a hot plate, an oven, or a furnace. A baking temperature is not particularly limited for the purpose of evaporation of the solvent, and the baking can be performed at, for example, 40° C. to 200° C.

A device for performing photoimprint is not particularly limited, as long as a desired pattern can be obtained. Examples of the device include commercially available devices, such as ST50 and ST50S-LEID, manufactured by TOSHIBA MACHINE Co., Ltd.; Sindre (registered trademark) 60, manufactured by Obducat Technologies AB; and NM-0801HB, manufactured by MEISYO KIKO Co., Ltd. A method, in which the imprint material applied onto a base material and mold are pressed by using the device, and light curing followed by mold release is performed, can be used.

Examples of a mold material for photoimprinting, which is used to produce a pattern-transferred film of the present invention, include quartz, silicon, nickel, alumina, carbonyl silane, glassy carbon, and polydimethyl silicone, but not particularly limited thereto, as long as a desired pattern is obtained. A mold release treatment in which a thin film of a fluorine compound or the like is formed on the surface of a mold may be performed, in order to improve mold release. Examples of a mold release agent used for a mold release treatment include OPTOOL (registered trademark) HD and OPTOOL DSX, manufactured by Daikin Industries, Ltd., but not particularly limited thereto, as long as a desired pattern is obtained.

In the present invention, generally, the 900 peeling test for evaluating a mold release force is a test in which an adhesive material (in the present invention, corresponding to a cured film formed from the imprint material) is attached to an adherend (in the present invention, corresponding to a film used as a base material), after the given time has passed, the adhesive material is peeled toward the 90° direction with a given peel rate, and a resistance force (a tensile force) is measured. The measurement is performed usually with an evaluation method by referencing JIS Z0237. The measured resistance force is converted to a value per width of the adherend, and the value can be evaluated as a mold release force. The imprint material of the present invention is applied onto a film; a coating film on the film is caused to adhere to a surface of a mold, which has a concavity and convexity shape; the coating film is light-cured while keeping adhering to the surface of the mold, which has a concavity and convexity shape; and a cured film on the film is tested by peeling it toward the 900 direction from the surface of the mold, which has a concavity and convexity shape, to measure a mold release force. The mold release force, that is, a load when the cured film on the film is completely peeled from the surface of the mold, which has a concavity and convexity shape, is converted to a value per 1 cm width of the film. The value is preferably over 0 g/cm, but not over 0.8 g/cm. Within the above-described range, a smaller value of the mold release force is more preferable.

A film thus produced from the imprint material of the present invention, on which a pattern is transferred; a semiconductor device having the film; and an optical component, a solid-state image sensing device, an LED device, a solar cell, a display, and an electronic device, having the films on their base materials are also included in the present invention.

EXAMPLES

Hereinafter, the present invention will be explained in further detail with Examples and Comparative Examples; however, the present invention is not limited to these examples.

The weight-average molecular weights of the silsesquioxane compounds obtained in the later-mentioned Synthesis Examples 1 and 2; and weight-average molecular weights of the silicone compounds. X-22-1602 and X-22-164, were measured by gel permeation chromatography (hereinafter, abbreviated as GPC). For the measurements, the GPC system manufactured by Tosoh Techno-System Inc. was used. The constitution and the measurement conditions of the GPC system are as below.
GPC machine: HLC-8320GPC
GPC column: Shodex (registered trademark) LF-804
Column temperature: 40° C.
Solvent: tetrahydrofuran
Flux: 1 mL/minute
Standard sample: six types of polystyrene having weight-average molecular weights different from each other (197,000, 55,100, 12,800, 3,950, 1,260, and 580)

Synthesis Example 1

To 2,000 mL four-neck flask, 486.98 g of 3-acryloyloxypropyltrimethoxysilane and 400.53 g of methanol were placed, and the content was cooled to 10° C. with stirring, and then a mixed solution of 112.23 g of a 0.1 N hydrochloric acid aqueous solution and 200.26 g of methanol was dropped in the flask over 30 minutes at 10° C. to 25° C. After that, the mixture was stirred at room temperature for 1 hour, stirred under reflux for 3 hours, and condensed under vacuum to obtain 287.21 g of a silsesquioxane compound (PS-1). The weight-average molecular weight of the silsesquioxane compound obtained in Synthesis Example 1 was measured by GPC, and was 1,500. The silsesquioxane compound has the repeat unit of Formula (4), and in the formula, Y is an acryloyloxy group, $R^5$ is a methylene group, and k is 3.

Synthesis Example 2

To 2,000 mL four-neck flask, 234.32 g of 3-acryloyloxypropyltrimethoxysilane, 136.22 g of methyl trimethoxysilane, and 400.53 g of methanol were placed, and the content was cooled to 10° C. with stirring, and then a mixed solution of 112.23 g of a 0.1 N hydrochloric acid aqueous solution and 200.26 g of methanol was dropped in the flask over 30 minutes at 10° C. to 25° C. After that, the mixture was stirred at room temperature for 1 hour, stirred under reflux for 3 hours, and condensed under vacuum to obtain 178.5 g of a silsesquioxane compound (PS-2). The weight-average molecular weight of the silsesquioxane compound obtained in Synthesis Example 2 was measured by GPC, and was 2,100. The silsesquioxane compound has the repeat unit of Formula (4), and in the formula, Y is an acryloyloxy group, $R^5$ is a methylene group, and k is 3.

Preparation of Imprint Material

Example 1

An imprint material PNI-a1 was prepared by mixing 3.5 g of butyl acrylate (manufactured by Tokyo Chemical Industry Co., Ltd.) (hereinafter, abbreviated as "butyl acrylate"), 6.0 g of AC-SQ TA-100 (manufactured by Toagosei Co., Ltd.) (hereinafter, abbreviated as "AC-SQ TA-100"), 0.5 g of X-22-1602 (manufactured by Shin-Etsu Chemical Co., Ltd.) (hereinafter, abbreviated as "X-22-1602"), and 0.1 g (1 phr to the total amount of butyl acrylate, AC-SQ TA-100, and X-22-1602) of Irgacure (registered trademark) 1173 (manufactured by BASF Japan Ltd.) (hereinafter, abbreviated as "Irgacure 1173"). Ille weight-average molecular weight of the X-22-1602 used in this Example was measured by GPC, and was 4,170.

Example 2

An imprint material PNI-a2 was prepared by mixing 6.5 g of butyl acrylate, 2.8 g of AC-SQ TA-100, 0.7 g of X-22-1602, and 0.1 g (1 phr to the total amount of butyl acrylate, AC-SQ TA-100, and X-22-1602) of Irgacure 1173.

Example 3

An imprint material PNI-a3 was prepared by mixing 9.0 g of butyl acrylate, 0.5 g of AC-SQ TA-100, 0.5 g of X-22-1602, and 0.1 g (1 phr to the total amount of butyl acrylate, AC-SQ TA-100, and X-22-1602) of Irgacure 1173.

Example 4

An imprint material PNI-a4 was prepared by mixing 6.5 g of LIGHT ACRYLATE 113-XA (manufactured by Kyoeisha Chemical Co., Ltd.) (hereinafter, abbreviated as "IB-XA"), 1.75 g of AC-SQ TA-100, 1.4 g of X-22-164 (manufactured by Shin-Etsu Chemical Co., Ltd.) (hereinafter, abbreviated as "X-22-164"), 0.35 g of X-22-1602, and 0.1 g (I phr to the total amount of IB-XA, AC-SQ TA-100, X-22-164, and X-22-1602) of Irgacure 1173. The weight-average molecular weight of the X-22-164 used in this Example was measured by GPC, and was 778.

Example 5

An imprint material PNI-a5 was prepared by mixing 6.5 g of 2-ethylhexyl acrylate (manufactured by Tokyo Chemical Industry Co., Ltd.) (hereinafter, abbreviated as "2-ethylhexyl acrylate"), 1.75 g of AC-SQ TA-100, 1.4 g of X-22-164, 0.35 g of X-22-1602, and 0.1 g (1 phr to the total amount of 2-ethylhexyl acrylate, AC-SQ TA-100, X-22-164, and X-22-1602) of Irgacure 1173.

Example 6

An imprint material PNI-a6 was prepared by mixing 6.5 g of butyl acrylate, 1.75 g of AC-SQ TA-100, 1.4 g of X-22-164, 0.35 g of X-22-1602, and 0.1 g (1 phr to the total amount of butyl acrylate, AC-SQ TA-100, X-22-164, and X-22-1602) of Irgacure 1173.

Example 7

An imprint material PNI-a7 was prepared by mixing 6.5 g of butyl acrylate, 2.5 g of AC-SQ TA-100, 0.65 g of X-22-164, 0.35 g of X-22-1602, and 0.1 g (1 phr to the total amount of butyl acrylate, AC-SQ TA-100, X-22-164, and X-22-1602) of Irgacure 1173.

Example 8

An imprint material PNI-a8 was prepared by mixing 6.5 g of butyl acrylate, 1.75 g of PS-1 obtained in Synthesis Example 1, 1.4 g of X-22-164, 0.35 g of X-22-1602, and 0.1 g (1 phr to the total amount of butyl acrylate, PS-1, X-22-164, and X-22-1602) of Irgacure 1173.

Example 9

An imprint material PNI-a9 was prepared by mixing 6.5 g of butyl acrylate, 1.75 g of PS-2 obtained in Synthesis Example 2, 1.4 g of X-22-164, 0.35 g of X-22-1602, and 0.1 g (1 phr to the total amount of butyl acrylate, PS-2, X-22-164, and X-22-1602) of Irgacure 1173.

Example 10

An imprint material PNI-a10 was prepared by mixing 6.5 g of butyl acrylate, 1.75 g of AC-SQ TA-100, 1.4 g of X-22-164, 0.35 g of X-22-1602, 0.1 g (1 phr to the total amount of butyl acrylate, AC-SQ TA-100, X-22-164, and X-22-1602) of Irgacur 1173, and 0.05 g (0.5 phr to the total amount of butyl acrylate, AC-SQ TA-100, X-22-164, and X-22-1602) of SUMILIZER (registered trademark) GA-80 (manufactured by Sumitomo Chemical Co., Ltd.) (hereinafter, abbreviated as "GA-80").

Example 11

An imprint material PNI-a11 was prepared by mixing 6.5 g of butyl acrylate, 1.75 g of AC-SQ TA-100, 1.4 g of X-22-164, 0.35 g of X-22-1602, 0.1 g (1 phr to the total amount of butyl acrylate, AC-SQ TA-100, X-22-164, and X-22-1602) of Irgacure 1173, 0.05 g (0.5 phr to the total amount of butyl acrylate, AC-SQ TA-100, X-22-164, and X-22-1602) of GA-80, and 0.001 g (0.01 phr to the total amount of butyl acrylate, AC-SQ TA-100, X-22-164, and X-22-1602) of MEGAFACE (registered trademark) R-30N (manufactured by DIC Corporation).

Example 12

An imprint material PNI-a12 was prepared by mixing 6.5 g of butyl acrylate, 1.75 g of AC-SQ TA-100, 1.4 g of X-22-164, 0.35 g of X-22-1602, 0.1 g (I phr to the total amount of butyl acrylate, AC-SQ TA-100, X-22-164, and X-22-1602) of Irgacure 1173, 0.05 g (0.5 phr to the total amount of butyl acrylate, AC-SQ TA-100, X-22-164, and X-22-1602) of GA-80, 0.001 g (0.01 phr to the total amount of butyl acrylate, AC-SQ TA-100, X-22-164, and X-22-1602) of MEGAFACE (registered trademark) R-30N (manufactured by DIC Corporation), and 0.53 g of propylene glycol monomethyl ether acetate.

Comparative Example 1

An imprint material PNI-b1 was prepared by mixing 6.5 g of butyl acrylate, 3.5 g of AC-SQ TA-100, and 0.1 g (1 phr to the total amount of butyl acrylate and AC-SQ TA-100) of Irgacure 1173.

Comparative Example 2

An imprint material PNI-b2 was prepared by mixing 10 g of AC-SQ TA-100 and 0.1 g (1 phr to AC-SQ TA-100) of Irgacur 1173.

Comparative Example 3

An imprint material PNI-b3 was prepared by mixing 7 g of AC-SQ TA-100, 3 g of X-22-1602, and 0.1 g (1 phr to the total amount of AC-SQ T-100 and X-22-1602) of Irgacure 1173.

Comparative Example 4

An imprint material PNI-b4 was prepared by mixing 7 g of PS-1 obtained in Synthesis Example 1, 3 g of X-22-1602, and 0.1 g (1 phr to the total amount of PS-1 and X-22-1602) of Irgacure 1173.

Comparative Example 5

An imprint material PNI-b5 was prepared by mixing 10 g of X-22-1602 and 0.1 g (1 phr to X-22-1602) of Irgacure 1173.

Photoimprint and Measurement of Plastic Deformation Rate

Two pieces of aluminum foil having thicknesses of 10 µm were layered, and attached to each of the edges of an alkali-free glass substrate, and gaps having the thicknesses (heights) of 20 µm were made on both of the edges of the alkali-free glass substrate as being parallel to each other. Then, each of the imprint materials obtained in Examples 1 to 11 and Comparative Examples 1 to 5 was potted between the gaps on the alkali-free glass substrate. The droplets of the imprint material were covered with a silicon wafer, and the silicon wafer and the alkali-free glass substrate were caused to adhere to each other via the gaps to prepare a sample. The prepared sample was placed in a nanoimprint device (NM-0801HB, manufactured by MEISYO KIKO Co., Ltd.), and pressurized to 100 N over 10 seconds to remove air bubbles between the gaps. Then, the sample was depressurized over 10 seconds, and was exposed in an electrodeless uniform illumination device (QRE-4016A, manufactured by ORC MANUFACTURING Co., Ltd.) at 400 mJ/cm$^2$. After the silicon wafer and the gaps were peeled off from the sample, the sample was baked for 1 hour on a hot plate while keeping the temperature at 100° C. to prepare a cured film having the thickness of 20 µm on the alkali-free glass substrate.

In a way similar to the above, gaps having the thicknesses (heights) of 20 µm were made on both of the edges of the alkali-free glass substrate, and the imprint material obtained in Example 12 which contains a solvent was potted between the gaps on the alkali-free glass substrate. After that, the sample was baked for 1 hour on a hot plate while keeping the temperature at 100° C. to remove a solvent from droplets. Then, in the same way as the above, the silicon wafer and the alkali-free glass substrate were caused to adhere to each other via the gaps to prepare a sample. Air bubbles were removed from the sample, and then the sample was subjected to exposure. After the silicon wafer and the gaps were peeled off from the sample, the sample was baked for 1 hour on a hot plate having the temperature of 100° C. to prepare a cured film having the thickness of 20 µm on the alkali-free glass substrate.

The plastic deformation rate of the obtained cured film is measured and calculated by using Nanoindenter ENT-2100 (manufactured by ELIONIX INC.) and titanium triangular indenter (manufactured by Tokyo Diamond Tools Mfg. Co., Ltd.) having an intercristal angle of 115° as an indenter. The obtained results are listed in Table 1.

Evaluation of Heat Resistance

A cured film having the thickness of 20 µm was formed on the alkali-free glass substrate in a way described in the above-described [Photoimprint and Measurement of Plastic Deformation Rate], by using each of the imprint materials obtained in Examples 1 to 12 and Comparative Examples 1 to 5. The cured film on the alkali-free substrate was baked for 3 minutes on a hot plate having the temperature of 265° C., and whether smoke is generated from the cured film was visually checked. The obtained results are listed in Table 1.

Evaluation of Crack Resistance

A cured film having the thickness of 20 µm was formed on the alkali-free glass substrate in a way described in the above-described [Photoimprint and Measurement of Plastic Deformation Rate], by using each of the imprint materials obtained in Examples 1 to 12 and Comparative Examples 1 to 5. The cured film on the alkali-free substrate was baked for 3 minutes on a hot plate having the temperature of 265° C., and then the film was placed onto a stainless table to be cooled rapidly. As for whether crack was seen in the cured film upon rapid cooling, the obtained results are listed in Table 1.

Photoimprint and Test of Mold Release Force

Each of the imprint materials obtained in Examples 1 to 11 and Comparative Examples 1 to 5 was applied onto a triacetyl cellulose film having the thickness of 80 μm (FUJITAC (registered trademark) manufactured by Fujifilm Corporation was used) (hereinafter, abbreviated as "TAC film") by using a bar coater (a full automatic film applicator KT-AB3120, manufactured by Kotec Ltd.). In addition, the imprint material obtained in Example 12 was applied onto the TAC film in the same way as above, and a solvent was dried to be removed. After that, each of the coating films on the TAC film was subjected to roller pressing to a moth-eye patterned mold. The coating film was exposed from the TAC film side in an electrodeless uniform illumination device (QRE-4016A, manufactured by ORC MANUFACTURING Co., Ltd.) at 350 mJ/cm² to be light-cured. Then the 90° peeling test was performed by referencing JIS Z0237, and a load when a cured film formed on the TAC film, that is, a pattern-transferred film that adheres to the surface of the mold, which has a concavity and convexity shape, was completely peeled from the surface of the mold was measured. A load per 1 cm width of the film was calculated as the mold release force (g/cm).

The obtained results are listed in Table 1.

TABLE 1

| | Plastic Deformation Rate (%) | Smoke Generation | Crack | Mold Release Force (g/cm) |
|---|---|---|---|---|
| Example 1 | 7.5 | No | No | 0.68 |
| Example 2 | 6.2 | No | No | 0.65 |
| Example 2 | 3.0 | No | No | 0.68 |
| Example 4 | 6.0 | No | No | 0.60 |
| Example 5 | 5.1 | No | No | 0.61 |
| Example 6 | 4.5 | No | No | 0.60 |
| Example 7 | 6.0 | No | No | 0.59 |
| Example 8 | 4.4 | No | No | 0.61 |
| Example 9 | 3.8 | No | No | 0.61 |
| Example 10 | 4.5 | No | No | 0.60 |
| Example 11 | 4.4 | No | No | 0.59 |
| Example 12 | 4.6 | No | No | 0.61 |
| Comparative Example 1 | 7.2 | No | No | 0.95 |
| Comparative Example 2 | 12.0 | No | Yes | 2.20 |
| Comparative Example 3 | 10.0 | Yes | Yes | 0.50 |
| Comparative Example 4 | 11.0 | Yes | Yes | 0.67 |
| Comparative Example 5 | 2.3 | Yes | No | 0.31 |

The results in Table 1 shows that, when imprint materials of Examples 1 to 12 were used, plastic deformation rates were low, that is, 8% or lower, and a mold release force was 0.7 g/cm or lower, smoke was not generated on the cured films when baking them at 265° C., and sublimation of degradation products were not observed. Also, crack was not observed upon rapid cooling from 265° C. Meanwhile, when imprint materials of Comparative Examples 1 to 4 were used, plastic deformation rates were over 8%, or a mold release force was over 0.8 g/cm. When the cured films obtained with imprint materials of Comparative Examples 2 to 5 were baked at 265° C., either it was recognized that degradation products were sublimed from the cured films since smoke was observed, or crack was observed in the cured films upon rapid cooling from 265° C. In summary, the cured film obtained from the imprint material of the present invention has a low plastic deformation characteristic of 8% or lower, a relatively low mold release force of 0.7 g/cm or less, as well as excellent heat resistance and crack resistance.

INDUSTRIAL APPLICABILITY

A cured film (a pattern-transferred film) produced from the imprint material of the present invention can be easily detached from a mold, and has a low plastic deformation characteristic, as well as excellent heat resistance and crack resistance. Accordingly, the cured film obtained from the imprint material can suitably be applied to products such as solar cells, LED devices, and displays.

The invention claimed is:

1. An imprint material consisting of:
   a component (A);
   a component (B);
   a component (C);
   a component (D);
   optionally a component (E) comprised of an antioxidant;
   optionally a component (F) comprised of a surfactant; and
   optionally a component (G) comprised of a solvent,
   wherein
      a content of the component (A) is 35 parts by mass to 90 parts by mass, a content of the component (B) is 5 parts by mass to 60 parts by mass, a content of the component (C) is 5 parts by mass to 30 parts by mass, and a content of the component (D) is 0.1 phr to 30 phr relative to a total content of component (A), component (B) and component (C) provided that the sum of the components (A), (B), and (C) is 100 parts by mass:
      the component (A) is a compound of Formula (1), Formula (2), or Formula (3) below:

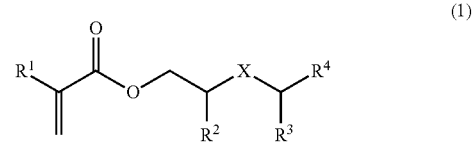

(1)

(2)

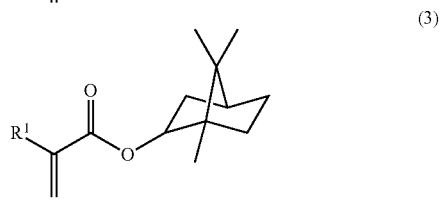

(3)

wherein in the Formulae (1) to (3), X is a $C_{1-5}$ linear alkylene group, $R^1$ is a hydrogen atom or a methyl group; each of $R^2$, $R^3$, and $R^4$ is independently a hydrogen atom, a methyl group, or an ethyl group; and the sum of the number of carbon atoms on $R^2$, $R^3$, and $R^4$ is an integer of 0 to 2;

the component (B) is a silsesquioxane compound having a repeating unit of Formula (4) below, and having two or more polymerizable groups of Y in Formula 4;

the component (C) is a silicone compound having a repeating unit of Formula (5) below, and having two polymerizable groups on its ends:

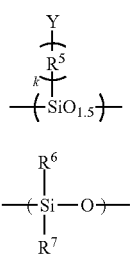

(4)

(5)

wherein in the Formulae (4) and (5), each of $R^6$ and $R^7$ is independently a $C_{1-3}$ alkyl group; $R^5$ is a $C_{1-3}$ alkylene group; and k is an integer of 0 to 3; and the component (D) is a photopolymerization initiator.

2. The imprint material according to claim 1, wherein the component (B) comprises a mixture of (i) a complete cage structure, an incomplete cage structure or both a complete cage structure and an incomplete cage structure, (ii) a random structure and (iii) a ladder structure.

3. The imprint material according to claim 1, wherein the component (C) comprises two or more compounds having weight-average molecular weights different from each other.

4. The imprint material according to claim 1, wherein the imprint material includes the antioxidant as a component (E).

5. The imprint material according to claim 1, wherein the imprint material includes the surfactant as a component (F).

6. The imprint material according to claim 1, wherein the imprint material includes the solvent as a component (G).

7. The imprint material according to claim 1, wherein the polymerizable groups of the component (B) and the component (C) are an acryloyloxy group, a methacryloyloxy group, a vinyl group, or an allyl group.

8. A film produced from the imprint material as claimed in claim 1, on which a pattern is transferred.

9. An optical component comprising, on a base material thereof, the film as claimed in claim 8, on which a pattern is transferred.

10. A solid-state image sensing device comprising, on a base material thereof, the film as claimed in claim 8, on which a pattern is transferred.

11. An LED device comprising, on a base material thereof, the film as claimed in claim 8, on which a pattern is transferred.

12. A semiconductor device comprising the film as claimed in claim 8, on which a pattern is transferred.

13. A solar cell comprising, on a base material thereof, the film as claimed in claim 8, on which a pattern is transferred.

14. A display comprising, on a base material thereof, the film as claimed in claim 8, on which a pattern is transferred.

15. An electronic device, on a base material thereof, comprising the film as claimed in claim 8, on which a pattern is transferred.

* * * * *